United States Patent
Ireland et al.

(10) Patent No.: US 6,986,097 B1
(45) Date of Patent: Jan. 10, 2006

(54) METHOD AND APPARATUS FOR GENERATING PARITY BITS IN A FORWARD ERROR CORRECTION (FEC) SYSTEM

(75) Inventors: Howard H. Ireland, Woodstock, GA (US); Jeffery T. Nichols, Marietta, GA (US)

(73) Assignee: Ciena Corporation, Linthicum, MD (US)

( * ) Notice: Subject to any disclaimer, the term of this patent is extended or adjusted under 35 U.S.C. 154(b) by 520 days.

(21) Appl. No.: 10/371,560

(22) Filed: Feb. 21, 2003

Related U.S. Application Data

(60) Provisional application No. 60/359,274, filed on Feb. 21, 2002.

(51) Int. Cl.
  *G06F 11/10*   (2006.01)
(52) U.S. Cl. .................. 714/801; 714/767; 714/752; 714/782
(58) Field of Classification Search ................ 714/767, 714/801
  See application file for complete search history.

(56) References Cited

U.S. PATENT DOCUMENTS

| | | | | |
|---|---|---|---|---|
| 5,191,584 A | * | 3/1993 | Anderson | 714/6 |
| 5,959,860 A | * | 9/1999 | Styczinski | 700/12 |
| RE36,448 E | * | 12/1999 | Brady | 714/763 |

| | | | | |
|---|---|---|---|---|
| 2002/0095642 A1 | * | 7/2002 | Karim et al. | 714/801 |

* cited by examiner

*Primary Examiner*—R. Stephen Dildine
(74) *Attorney, Agent, or Firm*—Dougherty Clements; Christopher L. Bernard; Tyler S. Brown

(57) ABSTRACT

A method and apparatus for performing parity bit generation. The apparatus of the present invention comprises a parity bit generator that multiplies words comprising message bits by a partial parity multiplication sub-matrix to generate intermediate parity values, and recursively adds (modulo-2) respective intermediate values together so that by the end of the recursive process, a final parity vector exists. This final parity vector can then be added to a message word to create a code word. By recursively using the partial parity multiplication sub-matrix in this way, the number of gates needed to perform parity bit generation is kept relatively small. Consequently the amount of power consumed by the parity bit generator during parity bit generation is relatively small. This is in contrast to typical parity bit generators, which multiply all of the message bits by a full parity multiplication matrix without recursion. The typical non-recursive process, which utilizes the complete parity multiplication matrix, requires a very large number of gates and a large area on an IC to implement the parity bit generator. Also, because of the large number of gates associated with parity bit generators that use the typical approach, those generators consume a large amount of power. The method and apparatus of the present invention are suitable for use with an encoder of a forward error correction (FEC) system.

20 Claims, 4 Drawing Sheets

$$\mathbf{R}_c = \left[ (m_{c*i} + R_{c-1}[n-k-i]) \quad (m_{c*i+1} + R_{c-1}[n-k-i+1]) \quad (m_{c*i+2} + R_{c-1}[n-k-i+2]) \cdots (m_{c*i+i-1} + R_{c-1}[n-k-i+1]) \right]$$

$$+ \left[ 0_0 \; 0 \; 0 \cdots 0 \; 0 \; 0_{i-1} \quad R_{c-1}[0] \; R_{c-1}[1] \; R_{c-1}[2] \cdots R_{c-1}[n-k-1-i] \right]$$

$$\begin{bmatrix}
a_{0,0} & a_{0,1} & \cdots & a_{0,n-k-1} \\
a_{1,0} & a_{1,1} & \cdots & a_{1,n-k-1} \\
a_{2,0} & a_{2,1} & \cdots & a_{2,n-k-1} \\
\vdots & \vdots & & \vdots \\
a_{i-2,0} & a_{i-2,1} & \cdots & a_{i-2,n-k-1} \\
a_{i-1,0} & a_{i-1,1} & \cdots & a_{i-1,n-k-1}
\end{bmatrix}$$

*FIG. 3*

METHOD AND APPARATUS FOR GENERATING PARITY BITS IN A FORWARD ERROR CORRECTION (FEC) SYSTEM

CROSS-REFERENCE TO RELATED APPLICATIONS

This application claims priority to a provisional application that was filed on Feb. 21, 2002, entitled OC-192 Forward Error Correction and Sonet Transport Overhead ASIC Functional Specification, having Ser. No. 60/359,274, which is incorporated by reference herein in its entirety.

TECHNICAL FIELD OF THE INVENTION

The present invention relates to communications and, more particularly, to a method and apparatus for generating parity bits in a forward error correction (FEC) system by recursively using a partial parity-bit-generation matrix to generate the parity bits, as opposed to typical FEC systems, which non-recursively use an entire parity-bit-generation matrix to generate the parity bits or by using a shift register approach to perform the binary encoding one bit at a time.

BACKGROUND OF THE INVENTION

When information is transmitted over a communications link between a receiver and a transmitter, the bits that describe the information being transmitted can be corrupted. In other words, the receiver may determine that a received bit that is supposed to be a binary 1 is a binary 0, and vice versa. Corruption of bits in a data stream may be caused by a variety of factors or components in the communications link. For example, in an optical fiber network, optical energy is transmitted in the form of optical pulses that have particular levels that correspond to binary 1s and 0s. If the level of the optical energy is too low, the receiver can have difficulty determining whether a pulse corresponds to a binary 1 or a binary 0. Repeaters, or amplifiers, normally are disposed at particular locations along the communications link that amplify the optical signals so that they are at the proper levels to enable the receiver to determine whether it has received a binary 1 or a binary 0. Typically, the optical signals are converted into electrical signals at the repeaters. The electrical signals are then amplified and converted into optical signals, which are then modulated back onto the optical fiber. Similarly, at the receiver, the optical signals typically are converted back into electrical signals, which the receiver compares to a threshold value to determine whether it has received a binary 1 or a binary 0.

Because it is possible for the bits to be corrupted, techniques have been developed and implemented that provide error correction. In other words, if a bit received by the receiver is erroneously determined to be a binary 1 when it was meant to be a binary 0 when it was transmitted, and vice versa, receivers utilize various techniques to determine whether a bit value has been incorrectly identified and to correct the bit value. One known technique used for such purposes is generally referred to as the "Automatic Repeat Request" (ARQ) technique. In accordance with this technique, when the receiver detects a bit error, it sends a signal to the transmitter that tells the transmitter to retransmit the block of data that contained the error. The receiver processes the retransmitted data block and detects bit errors. The data block may need to be retransmitted several times before the receiver determines that the data is without error. Of course, retransmitting data utilizes bandwidth and generally slows down the overall throughput of the communications system.

A technique known as Forward Error Correction (FEC) is commonly used in the communications industry to reduce errors in data being transmitted over a communications link without requiring retransmission of data. FEC not only detects bit errors, but corrects detected bit errors. One of the primary advantages of FEC over ARQ is that no retransmission of data is required with FEC. This is because FEC techniques introduce redundancy in the data bits that enables the receiver of a communications system to detect errors in data being transmitted and to correct the detected errors. The redundancy generally is introduced by utilizing data bits from the data stream to encode the data stream. The receiver has a decoder that has intelligence with regard to the encoding scheme used by the transmitter, which enables the receiver to decode the data and detect and correct errors without the need for retransmission. Another advantage of FEC is that, because it does not require retransmission of data, simplex links can be used, which is desirable in certain situations, such as when the receivers are receive-only terminals.

Generally, FEC techniques and systems fall into two broad categories, namely, block coding and convolution coding. Various block coding and convolution coding techniques are currently in use in the communications industry. In the past, the use of block codes has generally been limited to use in communications systems that have relatively low data rates for various reasons, such as the aforementioned adverse effects on overall coding gain (signal-to-noise ratio, $E_b/N_o$), which is expressed in decibels (dB), for short data bursts and the reduced overall throughput that can result from the synchronization requirement. Convolution coding has generally been the preferred FEC technique for high data rate implementations. However, convolution coding results in higher output bit error rates (BER) than the output (BERs) that can be achieved using block coding. Some customers want FEC systems with very low BERs (e.g., $10^{-15}$), which generally cannot be achieved using convolution coding, but which can be achieved using block coding, such as Bose-Chaudhuri-Hocquenghem (BCH) block coding, for example.

FEC coding requires that parity bits be inserted by the encoder of the FEC system into the block of data bits to be transmitted by the transmitter of the FEC system. On the receiver end, the parity bits are removed from the data block by the decoder of the FEC system. The generation of the parity bits by the FEC encoder for a linear block code (e.g., BCH code, Solomon-Reed code, etc.) traditionally has involved multiplication of the data block by a large parity-bit generation matrix. One of the disadvantages to the traditional approach is that, at high data bit rates, such as those used in optical transmission systems, for example, the matrix must be very large. Consequently, the number of logic gates needed to perform the parity bit generation must be very large. Of course, the greater the number of logic gates utilized by the parity bit generator is, the larger the amount of area needed on the integrated circuit (IC) to implement the generator is, and the greater the power consumption requirements.

It would be desirable to provide a parity bit generator that is suitable for high data bit rate transmission systems and the can be implemented with a relatively small number of logic gates, thereby decreasing the amount of area on the IC needed to implement the parity bit generator, which leads to a reduced power consumption requirements.

Accordingly, a need exists for a method and apparatus for performing parity bit generation with a reduced number of logic gates.

SUMMARY OF THE INVENTION

The present invention provides a method and apparatus for performing parity bit generation. The apparatus of the present invention comprises a parity bit generator that multiplies words comprising message bits by a partial parity multiplication sub-matrix to generate intermediate parity values, and recursively adds (modulo-2) respective intermediate values together so that by the end of the recursive process, a final parity vector exists. This final parity vector can then be added to a message word to create a code word. By recursively using the partial parity multiplication sub-matrix in this way, the number of gates needed to perform parity bit generation is kept relatively small while keeping the data rate high. Consequently the amount of power consumed by the parity bit generator during parity bit generation is relatively small. This is in contrast to typical parity bit generators, which multiply all of the message bits by a full parity multiplication matrix without recursion. The typical non-recursive process, which utilizes the complete parity multiplication matrix, requires a very large number of gates and a large area on an IC to implement the parity bit generator. Also, because of the large number of gates associated with parity bit generators that use the typical approach, those generators consume a large amount of power. To reduce the number of computations that must be performed, typical parity-bit generation techniques utilize a shift register approach, which requires a very small amount of logic, but which can only process one bit per cycle. This approach generally is suitable for low data rate systems, but in order for such an approach to be used in a high data rate system, the system would have to operate with a prohibitively fast clock speed.

The method and apparatus of the present invention are suitable for use with forward error correction (FEC) systems. The apparatus of the present invention is an encoder of an FEC system that comprises the parity bit generator of the present invention. The method of the present invention corresponds to operations performed by the encoder of the present invention to generate the parity bits used to create code words, which include a message word concatenated with a parity vector.

These and other features and advantages of the present invention will become apparent from the following description, drawings and claims.

BRIEF DESCRIPTION OF THE DRAWINGS

FIG. 3 illustrates the equation of the present invention by which parity bit generation is performed by redundantly using a partial parity generator sub-matrix, thereby decreasing the amount of logic needed to perform parity bit generation.

DETAILED DESCRIPTION OF THE PREFERRED EMBODIMENT OF THE INVENTION

The present invention is not limited to a single type of block coding. However, in order to provide an actual example of one way in which the present invention can be implemented, the present invention will be described herein with reference only to block coding commonly known in the FEC art as Bose-Chaudhuri-Hocquenghem (BCH) coding. However, those skilled in the art will understand, in view of the description provided herein, that the present invention is equally applicable many other types of block coding, and that the description of the present invention is being restricted only to BCH coding for purposes of brevity.

In accordance with the present invention, a sub-matrix (i.e., a subset of the parity bit matrix) having constant values is utilized and the message bits are recursively multiplied by the submatrix to generate the parity bit vector. In other words, the parity bit generation logic of the present invention employs a recursive algorithm that uses a sub-matrix created from the first i rows of the generator matrix, where i represents the data path width of a given encoder. The encoder may consist of j parity generators that are interleaved to achieve the desired encoder data width of j*i. This allows the parity bit generation logic to perform parity generation using i bits per system clock cycle. The following method describes an encoder implementing a block code of length n, with a message of length k, and a message word width of i.

Figure 1:
FIG. 1 illustrates the parity generator matrix as typically expressed.

In order to demonstrate the differences between the traditional parity bit generation technique and the method of the present invention, a description of the traditional technique will first be provided and then the method and apparatus of the present invention will be described. In the traditional approach using BCH code, the message polynomial is multiplied by the parity bit generator polynomial to generate the codeword G shown in FIG. 1 as the generator matrix 1. The matrix G can be reduced by removing the identity matrix (not shown) from the matrix G and translated into the form shown in FIG. 2, where R is the parity bit vector, $m_0$ through $m_{k-1}$ are the message bits in the data bit word of the data block that is being encoded, and k is the length of the message (i.e., the number of message bits in the data word). The parity multiplication matrix 3 has bit values $a_{0,0}$ through $a_{k-1, n-k-1}$. In the traditional approach represented by the mathematical equation shown in FIG. 2, the parity multiplication matrix 3 is multiplied by the message vector 2 having message bits $m_0$ through $m_{k-1}$ to obtain the parity bit vector R.

Figure 2:
FIG. 2 illustrates an equation that is a translation of the parity generator matrix shown in FIG. 1 with the identity matrix eliminated.

As can be seen from FIG. 2, the parity multiplication matrix 3, even though it has been reduced to eliminate the identity matrix, is very large in size. It has k rows (k equals the length of the message), and n–k columns, where n corresponds to the block code length and n–k corresponds to the number of parity bits. Although the parity bit vector R shown in FIG. 2 is non-recursively generated, in that its value is resolved once the message vector 2 has been multiplied by the parity multiplication matrix 3, an extremely large number of multiplication and addition operations must be performed before R is resolved. Because of the large number of multiplication and addition operations required, a large number of corresponding logic gates are required, which consume a large amount of area on the FEC IC and a large amount of power.

FIG. 3 illustrates a mathematical equation that mathematically defines the nature of the parity bit generator of the present invention and demonstrates the manner in which the values of the message vector 10 are recursively determined using a reduced parity multiplication sub-matrix 20. The matrix 3 shown in FIG. 2 has been reduced into sub-matrix 20 in accordance with the present invention through Gaussian elimination. The values of the sub-matrix 20 are constant and the sub-matrix 20 has only i rows and the same number of columns as the matrix 3 shown in FIG. 2. Because of the reduced number of rows of the parity multiplication sub-matrix 20 of the present invention, the number of gates needed to perform the multiplication and addition operations to generate the parity vector $R_c$ in accordance with the present invention is much less than the number of gates that would be needed for the traditional approach. The subscript c represents the number of message words that are processed in accordance with the equation shown in FIG. 3 as intermediate parity values are generated before the parity vector $R_c$ resolved (i.e., the number of recursions needed to resolve $R_c$). For example, assuming a code word of 7680 bits, of which 507 are parity bits and 7173 are message bits, and that the length of the words that are processed is 32, a total of 225 words (approximately 7173/32) would be recursively processed in accordance with the equation shown in FIG. 3 before the parity vector $R_c$ will be resolved to its final set of parity values. The final parity vector $R_c$ that would result after r recursions and that would be added to the 7173-bit message word would be a 507-bit parity vector.

The reduction in the amount of logic needed in accordance with the present invention due to the use of this recursive multiplication and the reduced parity multiplication sub-matrix will now be described. With reference again to FIG. 3, the values $R_{c-1}[n-k-i]$ up through $R_{c-1}[n-k-1]$ each correspond to a respective parity bit value obtained when a corresponding message vector 10 is multiplied by the parity multiplication matrix 20. The vector 30 added to the result of the multiplication of message vector 10 with parity multiplication matrix 20 corresponds to the immediately preceding resolved R values for the immediately preceding message vector. The multiplication results and the R vector 30 are modulo-2 added together (e.g., by exclusive-ORing (XORing)). For example, using the example values given in the previous paragraph, 225 32-bit message words would be processed by the equation shown in FIG. 3 before $R_c$ resolves to its final value. In this case, assuming the 32-bit message word that makes up the current message vector 10 is the 60$^{th}$ message word in the recursion process, the vector 30 would correspond to the resolved parity vector after recursively operating on message words 1 through 59.

The value of c is incremented by 1 after the generation of each $R_c$ vector has been completed. It can be seen that the vector 30 has i 0s at the beginning of the vector 30. This is because the first i R values are 0 for each resolved $R_c$ vector because no R values have been determined until at least one recursion has occurred.

Therefore, the first i R values will be 0. The first time that the multiplication vector 10 is multiplied by the multiplication sub-matrix 20, the subscript c is 0 for all terms in the vector 10 and no R values have yet been calculated. Therefore, the message vector 10 will consist only of message bits $m_{c*i}$ through $m_{c*i+i-1}$. When that message vector 10 is multiplied by the sub-matrix 20, the first R value, $R_{c-1}[n-k-i]$, will be produced. On the next recursion, $R_{c-1}[n-k-i]$ will have some value. However, all of the other parity terms $R_{c-1}[n-k-i+1]$, $R_{c-1}[n+k+i+2]$, etc., up through $R_{c-1}[n-k-1]$ still have not yet been calculated. Therefore, the message vector 10 will consist of $m_{c*i}$ plus the value for $R_{c-1}[n-k-i]$ that was subsequently determined as well as the message bits $m_{c*(i+1)}$, $m_{c*(i+2)}$ etc., through $m_{c*(i+i-1)}$. The message vector 10 having those terms will then be multiplied by the parity multiplication sub-matrix 20, which remains constant throughout the iterations, to generate the parity term $R_{c-1}[n-k-i+1]$.

At this point, only values for $R_{c-1}[n-k-i]$ and $R_{c-1}[n-k-i+1]$ have been determined. Therefore, in the next iteration, the message vector 10 will consist of $m_{c*i}$ plus the value for $Rc-1[n-k-i]$, $m_{c*(i+1)}$ plus the value for $R_{c-1}[n-k-i+1]$ and message bits $m_{c*(i+2)}$, $m_{c*(i+3)}$, etc., through $m_{c*(i+i+1)}$. The message vector 10 having those terms will then be multiplied by the parity multiplication sub-matrix 20 to generate the parity term $R_{c-1}[n-k-i+2]$. Therefore, in the next iteration, the message vector 10 will consist of $m_{c*i}$ plus the value for $Rc-1[n-k-i]$, $m_{c*(i+1)}$ plus the value for $R_{c-1}[n-k-i+1]$, $m_{c*(i+2)}$ plus the value for $R_{c-1}[n-k-i+2]$ and message bits $m_{c*(i+3)}$, $m_{c*(i+4)}$, etc., up through $m_{c*(i+i+1)}$. The message vector 10 having those terms will then be multiplied by the parity multiplication sub-matrix 20 to generate the parity term $R_{c-1}[n-k-i+3]$. This iterative process will continue until all of the parity terms $R_{c-1}[n-k-i]$, $R_{c-1}[n-k-i+1]$, $R_{c-1}[n-k-i+2]$, $R_{c-1}[n-k-i+3]$, etc., up through $R_{c-1}[n-k-1]$ have been generated, added to the respective message bits, multiplied by the parity multiplication sub-matrix 20 and modulo-2 added to R vector 30. At the end of the iterative process, the vector $R_c$ will be the resolved parity vector to be concatenated to the message word block to produce the code word block.

Figure 4:
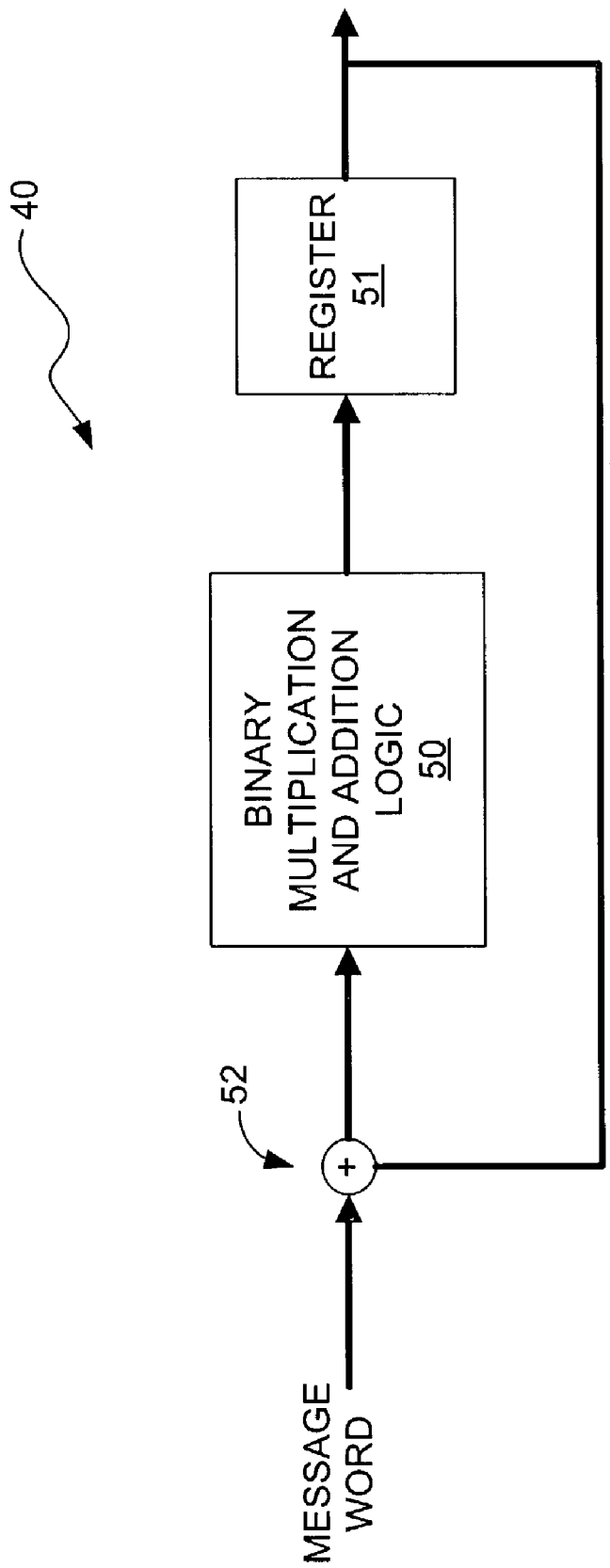
FIG. 4 is a block diagram of the apparatus of the present invention for generating parity bits.

FIG. 4 is a block diagram of the parity bit generator of the present invention. The parity bit generator 40 comprises a binary multiplication and binary addition logic component 50 (hereinafter a "binary multiplication-addition logic component 50"), which performs the logic operations associated with the equation shown in FIG. 3. The parity bit generator 40 also comprises a register 51, which stores the intermediate results produced during each recursion until the final recursion has been performed to produce the final parity vector to be included in a code word. The adder 52 indicates the recursive nature of the generator 40 and indicates that the results of the produced by the equation of FIG. 3 are modulo-2 added with their respective message bits in generating the message vector 10 of the equation shown in FIG. 3.

Figure 5:
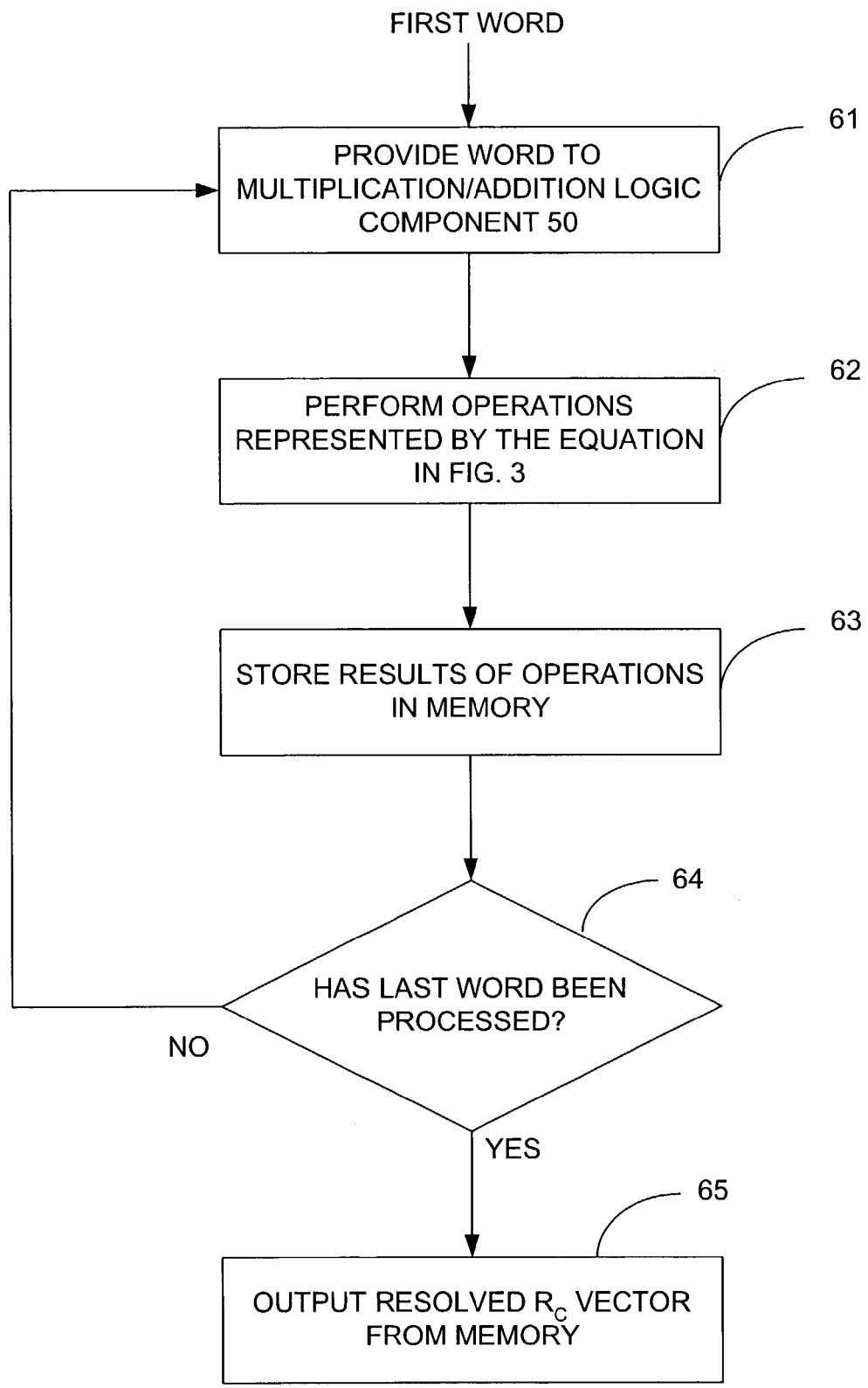
FIG. 5 is a flow chart illustrating the method of the present invention in accordance with the preferred embodiment performed by the apparatus shown in FIG. 4 in accordance with the equation shown in FIG. 3.

The method of the present invention in accordance with the preferred embodiment will now be described with reference to the flow chart illustrated in FIG. 5 and with respect to FIGS. 3 and 4. The order of the blocks of the flow chart does not necessarily represent the order in which the steps of the method are performed. The first message word to be operated on is provided to the binary multiplication-addition logic component 50 shown in FIG. 4, as indicated by block 61 in FIG. 5. The multiplication operations (ANDing) and modulo-2 addition operations (XORing) associated with multiplying the message vector 10 by the parity multiplication matrix and modulo-2 adding the results of those operations to the subsequently generated R vector 30 are then performed, as indicated by block 62. As stated above, prior to the first message vector 10 being processed, the R values in the vector 10 are initialized to 0 (not shown) for the aforementioned reasons (i.e., no R values have yet been determined).

The results of the operations produced by the step represented by block 62 are stored in memory (e.g., register 51 shown in FIG. 4), as indicated by block 63. A determination is then made as to whether $R_c$ has resolved into the final parity vector for the code word, as indicated by decision block 64. This determination can be accomplished in a variety of ways. For example, a counter can be incremented each time a word is processed and a comparator can be used to determine when the total number of words (e.g., 225 32-bit words) that make up the message word have been processed, thus indicating that the parity vector $R_c$ has resolved to its final value. For example, if 225 32-bit words make up one message word of a code word (the code word includes the message bits and the parity bits), the counter will increment from 0 to 224. Once the counter has incremented to 224 (i.e., 225 increments), the last word will have been processed by the binary multiplication-addition logic component 50 and stored in register 51. When the comparator determines that the counter has incremented to 226, the results stored in the register correspond to the resolved $R_c$ vector to be added to the corresponding code word, and the results stored in the register 51 are output for insertion into the code word, as indicated by block 65.

If (n−k)/i is not integer divisible (E.G., 7173/32=224.15), then the value (n−k)/i is rounded up to the next integer (e.g., 225). Then, for the last word (e.g., the $225^{th}$ word), 0s are added in front of the actual message bits to provide the word with the correct number of bits (e.g., 32). These additional steps are not shown in FIG. 5 for ease of illustration and explanation. However, in the case where (n−k)/i is not integer divisible, then prior to providing the last message word to the binary multiplication-addition logic component 50, as indicated by the arrow from block 64 to block 61, an additional step of adding these 0s before the message bits to complete the word would occur.

It should be noted that the present invention has been described with reference to particular embodiments for the purposes of demonstrating the principles and concepts of the present invention. Those skilled in the art will understand that present invention is not limited to these example embodiments. Also, those skilled in the art will understand, in view of the present disclosure, that a variety of logical configurations can be used to achieve the goals of the present invention. It should also be noted that although the present invention has been described herein as being performed in hardware in an IC (e.g., an application specific integrated circuit (IC)), the present invention may be implemented in hardware, in a combination of hardware and software, in a microprocessor, in a field programmable gate array, etc. Those skilled in the art will understand the way in which the tasks discussed herein can be performed by a variety of such physical implementations. Those skilled in the art will understand that a variety of changes can be made to the configurations described herein and shown in the figures, and that all such modifications are within the scope of the present invention.

What is claimed is:

1. An apparatus for performing parity bit generation, the apparatus comprising logic configured to use a partial parity multiplication sub-matrix to recursively generate intermediate parity vectors and to modulo-2 add the recursively generated intermediate parity vectors together until a final parity vector has been generated.

2. The apparatus of claim 1, wherein said logic comprises:
binary multiplication-addition logic configured to multiply a plurality of message vectors comprising a plurality of message bits by the partial parity multiplication sub-matrix to produce the intermediate parity vectors and to recursively modulo-2 add the intermediate parity vectors together; and
a memory element logic configured to store the intermediate parity vectors and results of the recursive modulo-2 addition of the intermediate parity vectors, and wherein after a particular number of intermediate parity vectors have been recursively generated and modulo-2 added together, the memory element contains a final parity vector.

3. The apparatus of claim 1, wherein the apparatus is an encoder implemented in a forward error correction (FEC) system.

4. The apparatus of claim 1, wherein the partial parity multiplication sub-matrix is obtained by selecting the first i rows of the systematic parity generator matrix, where i is the desired data path width.

5. The apparatus of claim 2, wherein each value in the intermediate parity vector corresponds to a message bit modulo-2 added with a respective intermediate parity value that was generated in an immediately preceding recursive multiplication of a message vector by the partial parity multiplication sub-matrix.

6. The apparatus of claim 5, wherein said plurality of message vectors together make up a message word, and wherein after the final parity vector has been generated, the final parity vector is concatenated with the message word to produce a code word.

7. The apparatus of claim 6, wherein the code word is a Bose-Chaudhuri-Hocquenghem (BCH) block code word.

8. The apparatus of claim 2, wherein the binary multiplication-addition logic comprises AND gates for performing binary multiplication and exclusive-OR (XOR) gates for performing modulo-2 addition.

9. The apparatus of claim 2, wherein the binary multiplication-addition logic comprises NAND gates for performing binary multiplication and exclusive-NOR (XNOR) gates for performing modulo-2 addition.

10. A method for performing parity bit generation, the method comprising using a partial parity multiplication sub-matrix to recursively generate intermediate parity vectors and modulo-2 adding the recursively generated intermediate parity vectors together until a final parity vector has been generated.

11. The method of claim 10, wherein the partial parity multiplication sub-matrix is used by binary multiplying a plurality of message vectors comprising a plurality of message bits by the partial parity multiplication sub-matrix to produce the intermediate parity vectors, and wherein the method further comprises the step of:
storing the intermediate parity vectors and results of the recursive modulo-2 addition of the intermediate parity vectors in a memory element, and wherein after a particular number of intermediate parity vectors have been recursively generated and modulo-2 added together, the memory element contains a final parity vector.

12. The method of claim 10, wherein the method is implemented in an encoder a forward error correction (FEC) system.

13. The method of claim 10, wherein the partial parity multiplication sub-matrix is obtained by selecting the first i rows of the systematic parity generator matrix, where i is the desired data path width.

14. The method of claim 11, wherein each value in the intermediate parity vector corresponds to a message bit modulo-2 added with a respective intermediate parity value that was generated in an immediately preceding recursive multiplication of a message vector by the partial parity multiplication sub-matrix.

15. The method of claim 14, wherein said plurality of message vectors together make up a message word, and wherein after the final parity vector has been generated, the final parity vector is concatenated with the message word to produce a code word.

16. The method of claim 15, wherein the code word is a Bose-Chaudhuri-Hocquenghem (BCH) block code word.

17. The method of claim 11, wherein the step of binary multiplying a plurality of message vectors comprising a plurality of message bits by the partial parity multiplication sub-matrix to produce the intermediate parity vectors binary is performed in multiplication-addition logic that comprises AND gates for performing binary multiplication and exclusive-OR (XOR) gates for performing modulo-2 addition.

18. The method of claim 11, wherein the step of binary multiplying a plurality of message vectors comprising a plurality of message bits by the partial parity multiplication sub-matrix to produce the intermediate parity vectors binary is performed in multiplication-addition logic that comprises NAND gates for performing binary multiplication and exclusive-NOR (XNOR) gates for performing modulo-2 addition.

19. A computer program for performing parity bit generation, the computer program being embodied on a computer-readable medium, the program comprising a routine that uses a partial parity multiplication sub-matrix to recursively generate intermediate parity vectors and modulo-2 adds the recursively generated intermediate parity vectors together until a final parity vector has been generated.

20. The computer program of claim 19, wherein routine uses the partial parity multiplication sub-matrix by binary multiplying a plurality of message vectors comprising a plurality of message bits by the partial parity multiplication sub-matrix to produce the intermediate parity vectors, and wherein the program further comprises:

a code segment that stores the intermediate parity vectors and results of the recursive modulo-2 addition of the intermediate parity vectors in a memory element, and wherein after a particular number of intermediate parity vectors have been recursively generated and modulo-2 added together, the memory element contains a final parity vector.

* * * * *